United States Patent
Grodzki et al.

(10) Patent No.: US 9,547,062 B2
(45) Date of Patent: Jan. 17, 2017

(54) METHOD AND MAGNETIC RESONANCE APPARATUS TO GENERATE AN ARTIFACT-FREE MAGNETIC RESONANCE IMAGE DATA SET

(71) Applicants: David Grodzki, Erlangen (DE); Patrick Gross, Buckenhof (DE)

(72) Inventors: David Grodzki, Erlangen (DE); Patrick Gross, Buckenhof (DE)

(73) Assignee: Siemens Aktiengesellschaft, Munich (DE)

( * ) Notice: Subject to any disclaimer, the term of this patent is extended or adjusted under 35 U.S.C. 154(b) by 655 days.

(21) Appl. No.: 14/039,293

(22) Filed: Sep. 27, 2013

(65) Prior Publication Data

US 2014/0091796 A1    Apr. 3, 2014

(30) Foreign Application Priority Data

Sep. 28, 2012 (DE) .......................... 10 2012 217 810

(51) Int. Cl.
   *G01R 33/565* (2006.01)
   *G01R 33/24* (2006.01)

(52) U.S. Cl.
   CPC ......... *G01R 33/56572* (2013.01); *G01R 33/24* (2013.01)

(58) Field of Classification Search
   CPC ..................... G01R 33/56572; G01R 33/24
   See application file for complete search history.

(56) References Cited

U.S. PATENT DOCUMENTS

| | | | |
|---|---|---|---|
| 5,617,028 A | | 4/1997 | Meyer et al. |
| 5,742,163 A | * | 4/1998 | Liu ................. G01R 33/56554 |
| | | | 324/307 |
| 6,566,877 B1 | | 5/2003 | Anand et al. |

OTHER PUBLICATIONS

Latta P. et al., "Single Point Imaging with Suppressed Sound Pressure Levels Through Gradient-Shape Adjustment", Proc. Intl. Soc. Mag. Reson. Med., vol. 11, p. 2349, (2004).

(Continued)

*Primary Examiner* — Rodney Bonnette
(74) *Attorney, Agent, or Firm* — Schiff Hardin LLP

(57) ABSTRACT

In a method and magnetic resonance (MR) system for the creation of an artifact-free image data set of an imaging area located in a measurement volume of the MR system, measurement data are acquired from which an image data is to be reconstructed, with gradients for spatially coding of the measurement data are ramped continuously over time to a strength desired for the acquisition of the measurement data, without abrupt changes in the gradient strength. The actual gradients present in the measurement volume are measured by a field mapping device in the measurement volume of the MR system. The trajectories along which k-space is scanned during the acquisition of the measurement data are calculated on the basis of the measured actual gradients. An artifact-free image data set is reconstructed from the acquired measurement data under consideration of the calculated trajectories, and is displayed and/or stored.

8 Claims, 3 Drawing Sheets

(56) References Cited

OTHER PUBLICATIONS

Segbers M. et al., "Optimized MRI Gradient Waveforms for Acoustic Noise Reduction," Proc. Intl. Soc. Mag. Reson Med., vol. 16, p. 1349, (2008).
Grodzki et al., "Ultra short Echo Time Imaging using Pointwise Encoding Time reduction with Radial Acquisition (PETRA)," Proc. Intl. Soc. Mag. Reson. Med., vol. 19, 2011, p. 2815.
Dietrich et al., "A stand-alone system for concurrent gradient and RF sequence monitoring," Proc. Intl. Soc. Mag. Reson. Med., vol. 20, 2012, p. 700.

\* cited by examiner

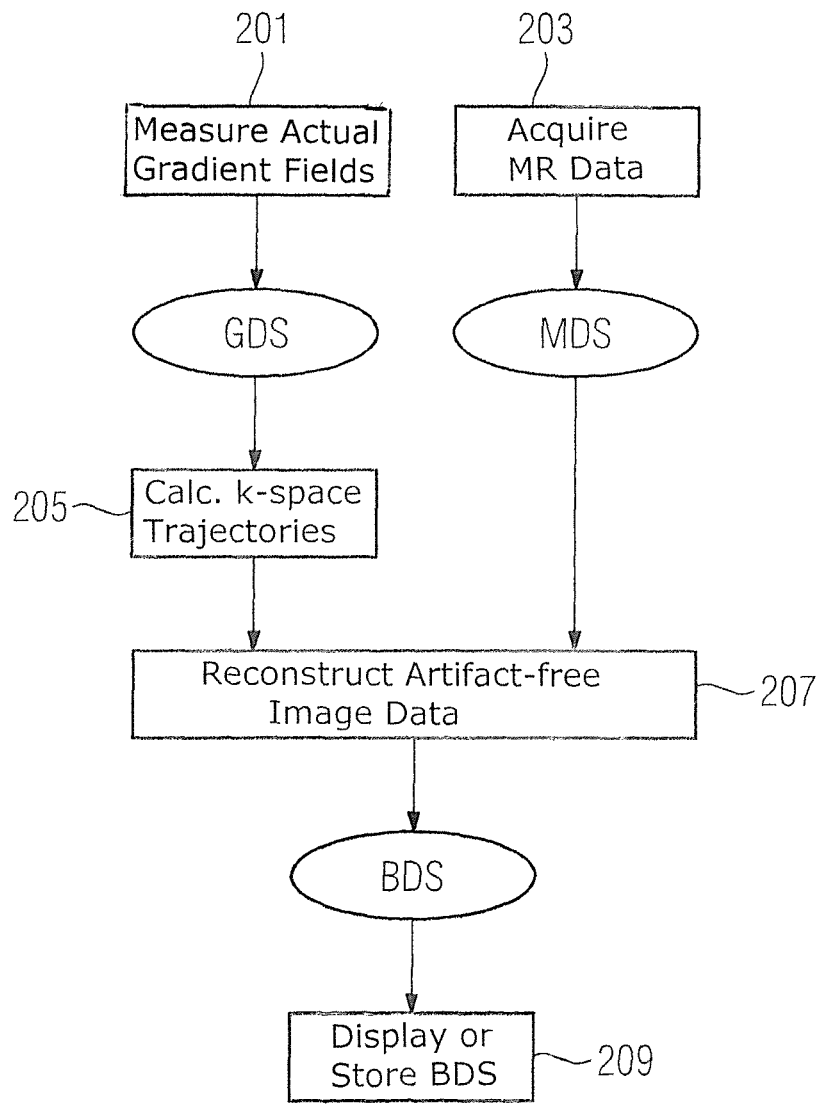

METHOD AND MAGNETIC RESONANCE APPARATUS TO GENERATE AN ARTIFACT-FREE MAGNETIC RESONANCE IMAGE DATA SET

BACKGROUND OF THE INVENTION

Field of the Invention

The present invention concerns a method to create an artifact-free magnetic resonance image data set, as well as a magnetic resonance system and an electronically readable data medium for executing such a method.

Description of the Prior Art

Magnetic resonance (MR) is a known modality with which images of the inside of an examination subject can be generated. Expressed in a simplified form, the examination subject is positioned in a strong, static, homogeneous basic magnetic field (also called a $B_0$ field) with a field strength from 0.2 Tesla to 7 Tesla or more in a magnetic resonance apparatus, such that the nuclear spins of the examination subject orient along the basic magnetic field. To trigger nuclear magnetic resonances, radio-frequency excitation pulses (RF pulses) are radiated into the examination subject, and the triggered nuclear magnetic resonance signals are entered into an electronic memory organized as k-space data, on the basis of which MR images are reconstructed or spectroscopy data are determined. For spatial coding of the measurement data, rapidly switched (activated) magnetic gradient fields are superimposed on the basic magnetic field. The acquired measurement data are digitized and stored as complex numerical values in a k-space matrix. An associated MR image can be reconstructed from the k-space matrix populated with values, for example by means of a multidimensional Fourier transformation.

MR examinations are most often very loud. The main reason for this that is the rapidly changing gradient magnetic fields (also called just gradients) used for the measurement, cause eddy currents, distortions and oscillations in the gradient system that is used, in particular the gradient coil that is used. This energy also transfers to the housing of the magnetic resonance system, which then likewise oscillates and therefore itself emits noise.

In order to design an MR examination to be as quiet as possible, pulse sequences for the acquisition of magnetic resonance measurement data can be used in which the changes of the gradients over time (dG/dt)—also called the slew rate—are as small as possible.

An example of such a "quiet sequence" is known as the PETRA sequence as described in the article by Grodzki et al.: "Ultra short Echo Time Imaging using Pointwise Encoding Time reduction with Radial Acquisition (PETRA)", Proc. Intl. Soc. Mag. Reson. Med. 19 (2011), Page 2815.

In the reconstruction of image data sets from the measurement data acquired by means of a pulse sequence, it is important to know the gradients switched in the acquisition of the measurement data—and therefore the trajectories along which k-space corresponding to the examination subject has been scanned—as optimally as possible.

Techniques known as field mapping and associated field mapping devices are known in order to measure gradient fields in the measurement volume of a magnetic resonance system. A particularly robust field mapping technique and device is described in, for example, the article by Dietrich et al.: "A stand-alone system for concurrent gradient and RF sequence monitoring", Proc. Intl. Soc. Mag. Reson. Med. 20 (2012), Page 700.

SUMMARY OF THE INVENTION

An object of the present invention is to provide a method to create an artifact-free image data set, and a magnetic resonance system, and an electronically readable data storage medium that enable the creation of artifact-free image data sets using particularly quiet pulse sequences.

A method according to the invention for the creation of an artifact-free image data set of an imaging area located in a measurement volume of a magnetic resonance system by operating the magnetic resonance system includes the steps:

acquire measurement data from which an image data set should be reconstructed, wherein gradients for spatial coding in the acquisition of the measurement data are ramped continuously over time to the strength desired in the acquisition of the measurement data without abrupt changes in the gradient strength, measure actual gradients present in the measurement volume by means of a field mapping device arranged in the measurement volume of the magnetic resonance system, calculate the trajectories along which k-space has been scanned during the acquisition of the measurement data, on the basis of the measured actual gradients, reconstruct an artifact-free image data set from the acquired measurement data under consideration of the calculated trajectories, display and/or store the artifact-free image data set.

The invention is based on the following considerations.

In order to design sequences to be particularly quiet—i.e. particularly low in induction effects causing noise in the gradient coils given implementation of the sequences—sharp edges in the gradient curve should be avoided, thus abrupt changes in the gradient strength over time. Instead of these, rounded, slow, continuous changes in the gradient strength over time are suitable for generating particularly small noise-causing induction effects in the gradient coils. Namely, few high frequencies which were transferred as oscillations from the gradient coil to the housing of the magnetic resonance system arise in the acoustic frequency curve of the sequence due to such a rounding of the gradient curves. However, these high frequencies are specifically particularly uncomfortable for a patient located in the magnetic resonance system and are reproduced particularly loudly by the gradient system.

However, with such continuously rounded gradient coils a necessary gradient moment or, respectively, a necessary gradient strength is achieved more slowly given the same slew rate than given abrupt changes (and therefore "corners") in the gradient curve. Therefore, the time plan of the complete sequence would possibly need to be adapted, with which the entire duration of the MR examination would also increase.

If the gradients were permitted not to have a constant value of the gradient strength (as in a standard sequence) during the complete acquisition of measurement, but rather to possibly assume values deviating from the otherwise maintained constant value at the beginning and at the end of an acquisition, the actually scanned k-space trajectory would change. These actually scanned k-space trajectories cannot be calculated from the switched curve of the gradients without additional measures since rounded, continuous gradient curves can occur without time delays and eddy currents. Therefore, the attempt to calculate the actual trajectories in k-space is severely plagued with errors, which often lead to additional artifacts in an image reconstructed on the basis of the incorrectly calculated k-space trajectories.

A comparison of an "angular" gradient coil with abrupt changes of the gradient strength G over time t (upper graph) with a rounded gradient curve with slow, continuous changes in the gradient strength G over time t (lower graph) is schematically presented in FIG. 1.

Both the upper graph and the lower graph show the time curve of a readout gradient G. The gradient G should be constant during the acquisition of the measurement data, thus during the readout process in the time period ACQ, so that the k-space value that is hereby scanned can simply be determined. Eddy currents that interfere with the acquisition can occur in the gradient coils precisely during the gradient ramping in the ramping of the gradients up or, respectively, down. If the gradient curves are rounded as shown in the lower graph, the desired gradient strength is achieved later given the same maximum slew rate than given abrupt changes in the gradient curve. In the shown example, the gradient strength in the lower graph is thereby not constant during the entire readout process ACQ, but rather deviates from the desired constant value at the beginning and at the end of the readout process ACQ.

With the method according to the invention it is possible to create artifact-free image data sets even given rounded, continuous gradient curves during the acquisition of the measurement data since artifacts which arise due to a rounding of gradient curves (and therefore time delays and eddy currents that are caused in the gradient system) are compensated by means of a field mapping technique. Via the field mapping technique it is possible to calculate the actual time curve of the gradients, and therefore the correctly scanned k-space values. A reconstruction of artifact-free images is therefore possible. Sequences which use the method according to the invention can thus be designed to be particularly quiet, and therefore comfortable for the patient.

In a method according to the invention, the gradients cannot run constantly during the complete acquisition of measurement data due to the continuous change.

For particularly quiet MR examinations, the slew rates used in the acquisition of the measurement data are kept as small as possible. For this, the gradients for spatial coding in the acquisition of the measurement data are moved only with such small changes in the gradient strength over time that oscillations caused by the changes of the gradient strengths are avoided.

Furthermore, gradients for spatial coding in the acquisition of measurement data from which an image data set should be reconstructed are ramped continuously (without abrupt changes in the gradient strength over time) to the strength desired after the acquisition of the measurement data in order to optimize the measurement further in the direction of the low-noise measurement.

A magnetic resonance system according to the invention has a basic field magnet, a gradient field system, a radio-frequency antenna, a control device to control the gradient field system and the radio-frequency antenna, and an image computer to receive measurement signals received by the radio-frequency antenna and to evaluate the measurement signals and to create magnetic resonance images. The control device furthermore has a field calculation device to process the data measured by a field mapping device. The magnetic resonance system is designed to implement a method according to the invention as described herein. The magnetic resonance system can itself form the field mapping device.

An electronically readable data medium according to the invention is encoded with electronically readable control information, and the control information cause the method according to the invention as described herein to be executed given use of the data medium in a control device of a magnetic resonance system.

The advantages and embodiments indicated with regard to the method apply analogously to the magnetic resonance system and the electronically readable data medium.

BRIEF DESCRIPTION OF THE DRAWINGS

FIG. 3 is a flowchart of an embodiment of a method according to the invention for the creation of an artifact-free image data set of an imaging area located in a measurement volume of a magnetic resonance system by means of said magnetic resonance system.

DESCRIPTION OF THE PREFERRED EMBODIMENTS

Figure 1:
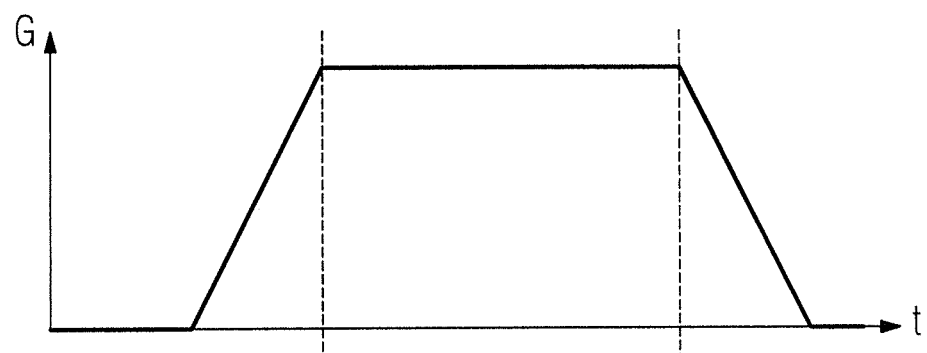
FIG. 1 schematically shows the influence of continuous changes in the gradient strength over time in contrast to abrupt changes in the gradient strength over time.
Figure 1:
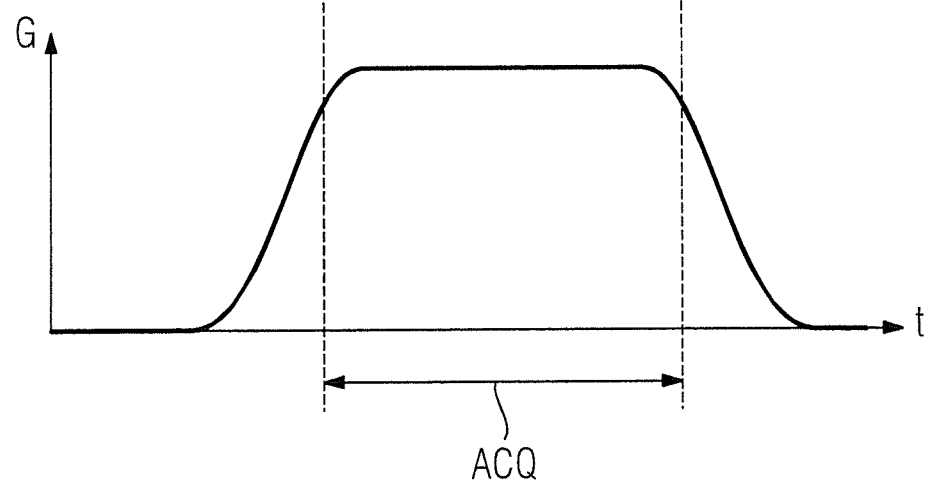
Figure 2:
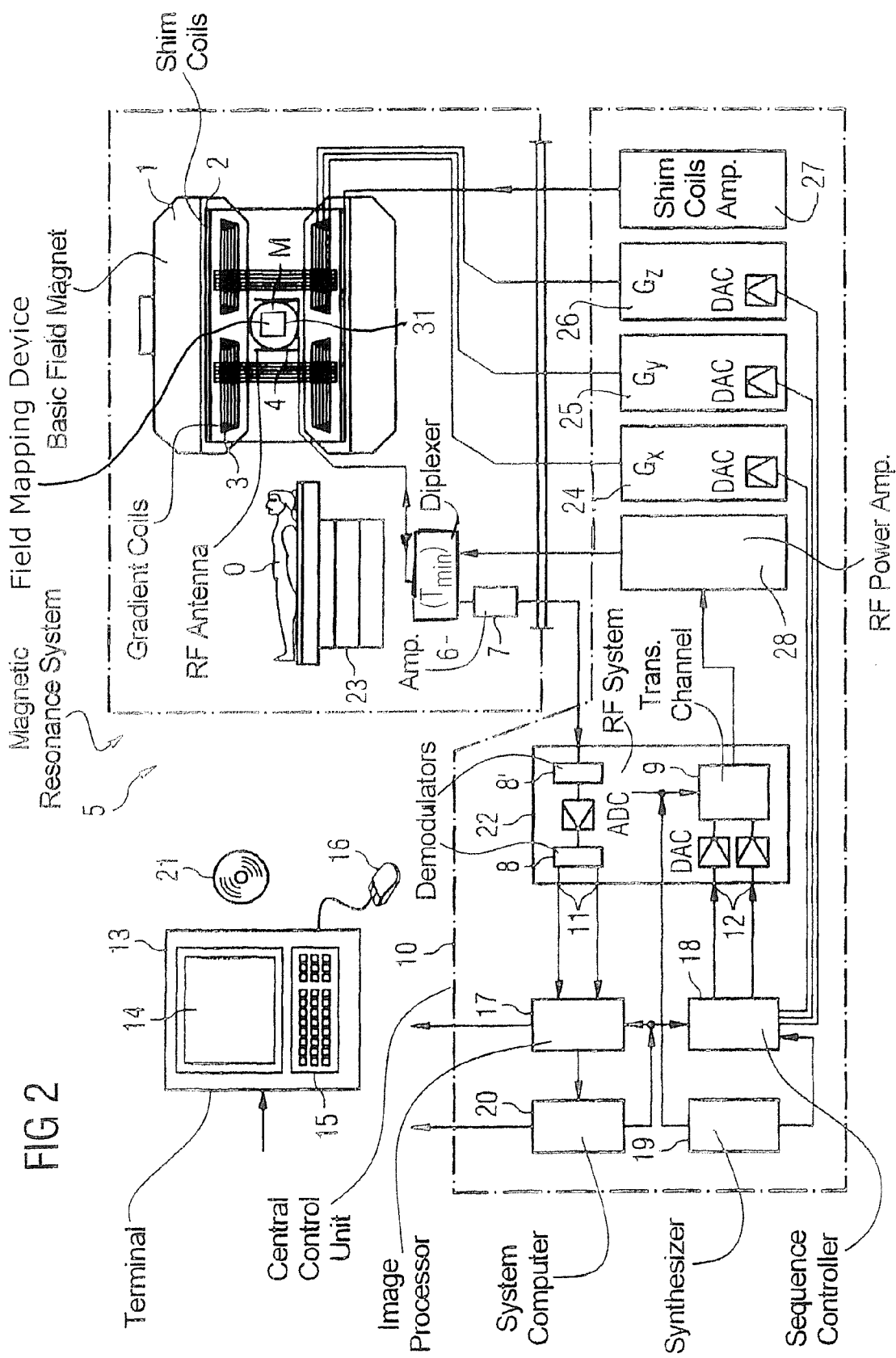
FIG. 2 schematically illustrates a magnetic resonance system according to the invention.

FIG. 2 shows a schematic representation of a magnetic resonance system 5 (a magnetic resonance imaging or magnetic resonance tomography apparatus). A basic field magnet 1 generates a temporally constant, strong magnetic field for polarization or alignment of the nuclear spins in an examination area of an examination subject U (for example a part of a human body that is to be examined) which lies on a table 23 and is slid into the magnetic resonance system 5. The high homogeneity of the basic magnetic field that is required for the nuclear magnetic resonance measurement is defined in a typically spherical measurement volume M into which are introduced the parts of the human body that are to be examined. To support the homogeneity requirements, and in particular to eliminate temporally invariable influences, what are known as shim plates made of ferromagnetic material are mounted at a suitable location. Temporally variable influences are eliminated by shim coils 2 and a suitable controller 27 for the shim coils 2.

In the basic field magnet 1, a cylindrical gradient coil system 3 is used which comprises three sub-windings. Each sub-winding is supplied by a corresponding amplifier 24-26 with current to generate a linear gradient field in the respective direction of a Cartesian coordinate system. The first sub-winding of the gradient field system 3 generates a gradient $G_x$ in the x-direction, the second sub-winding generates a gradient $G_y$ in the y-direction, and the third sub-winding generates a gradient $G_z$ in the z-direction. The amplifiers 24-26 each include a digital/analog converter (DAC) that is controlled by a sequence controller 18 for accurately-timed generation of gradient pulses.

The magnetic resonance system 5 includes a field mapping device 31 that, for the measurement of the gradients, is arranged at least partially in the measurement volume M of the magnetic resonance system 5. An example of a field mapping device 31 is described in the article by Dietrich et al. that is cited above, for example.

Located within the gradient field system 3 is a radio-frequency antenna 4 which convert the radio-frequency pulses emitted by a radio-frequency power amplifier into an alternating magnetic field for excitation of the nuclei and alignment of the nuclear spins of the subject to be examined or, respectively, of the region of the subject that is to be examined. The radio-frequency antenna 4 has one or more RF transmission coils and one or more RF reception coils in the form of an arrangement (for example annular, linear or matrix-like) of component coils. The alternating field emanating from the precessing nuclear spins—i.e. normally the spin echo signals caused by a pulse sequence made up of one or more radio-frequency pulses and one or more gradient pulses—is also converted by the RF reception coils of the radio-frequency antenna 4 into a voltage (measurement signal) which is supplied via an amplifier 7 to a radio-frequency reception channel 8, 8' of a radio-frequency system 22. The radio-frequency system 22 furthermore has a transmission channel 9 in which the radio-frequency pulses are generated for the excitation of the nuclear spins. The respective radio-frequency pulses are digitally represented in the sequence controller 18 as a series of complex numbers based on a pulse sequence predetermined by the system computer 20. This number sequence is supplied as a real part and imaginary part to a digital/analog converter (DAC) in the radio-frequency system 22 via respective inputs 12, and from said digital/analog converter (DAC) to the transmission channel 9. In the transmission channel 9, the pulse sequences are modulated on a radio-frequency carrier signal whose base frequency corresponds to the resonance frequency of the nuclear spins in the measurement volume. The modulated pulse sequences are supplied via an amplifier 28 to the RF transmission coil of the radio-frequency antenna 4.

The switching from transmission operation to reception operation takes place via a transmission/reception diplexer 6, which requires a minimum switching time $T_{min}$ to switch from transmission mode to reception mode. The RF transmission coil of the radio-frequency antenna 4 radiates the radio-frequency pulses for excitation of the nuclear spins into the measurement volume M, and detects (receives) the scans resulting echo signals via RF reception coils. The acquired magnetic resonance signals are phase-sensitively demodulated to an intermediate frequency in a first demodulator 8' of a reception channel of the radio-frequency system 22 and are digitized in an analog/digital converter (ADC). This signal is further demodulated to a frequency of zero. The demodulation to a frequency of zero and the separation into real part and imaginary part occur in a second demodulator 8 after the digitization in the digital domain. The second demodulator 8 provides the demodulated data to an image computer 17 via outputs 11.

An MR image is reconstructed by the image computer 17 from the measurement data acquired in such a manner, in particular using the measured fields, for which purpose the control unit 10 includes (for example) a field calculation device 30 to process the data measured by the field mapping device 31. This field calculation device 30 is designed to calculate, from fields (for example gradients) measured by the field mapping device 31, the k-space trajectory actually scanned while switching (activating) the gradients.

The sequence controller 18 controls the accurately-timed switching of the gradients, the emission of the radio-frequency pulses with defined phase amplitude and the reception of the nuclear magnetic resonance signals. The time base for the radio-frequency system 22 and the sequence controller 18 is provided by a synthesizer 19. The selection of corresponding control programs to generate an MR image (which control programs are stored on a DVD 21, for example), as well as other inputs on the part of the user and the presentation of the generated MR image, take place via a terminal 13 that has a keyboard 15 and/or a mouse 16 (for example) to enable an input and display means—for example a monitor 14—to enable a display.

FIG. 3 shows a flowchart of the embodiment of the method according to the invention for the creation of an artifact-free image data set of an imaging area located in a measurement volume of a magnetic resonance system 5, by operation of the magnetic resonance system 5.

In Step 203 measurement data are acquired by the magnetic resonance system 5, from which measurement data an image data set should be reconstructed, wherein gradients for spatial coding are ramped continuously—without abrupt changes in the gradient strength over time—in the acquisition of the measurement data to the strength desired in the acquisition of the measurement data, and said measurement data are stored in a measurement data set MDS.

In another Step 201, fields (in particular gradients) that are actually present in the measurement volume are measured and stored in a gradient data set by, for example, the field mapping device 30 arranged in the measurement volume of the magnetic resonance system 5.

On the basis of the measured actual gradients, in a further Step 205 the trajectories are calculated along which k-space has been scanned upon switching of the measured gradients during the acquisition of the measurement data.

For example, this occurs by means of a field mapping technique as mentioned above (for example according to the cited article by Dietrich et al.) with which gradient curves can be measured precisely, and k-space trajectories can be calculated precisely therefrom.

From the acquired measurement data MDS, in a further Step 207 an artifact-free image data set BDS is reconstructed, wherein the k-space trajectories calculated in Step 205 are taken into account and used in the reconstruction. Possible time delays and eddy currents associated with the switched gradients in the reconstruction are thus compensated by taking into account the actual gradients present during the acquisition of the measurement data, and the arising image data set BDS is thus free of artifacts caused by incorrect gradients.

The artifact-free image data set BDS can be displayed and/or stored in a further Step 209.

The measurement of the actual gradients present in the measurement volume in Step 201 can hereby take place simultaneously with the acquisition of the measurement data. For example, field probes can be used in the field mapping device 30 that detect magnetic resonance signals produced by nuclei other than the nuclei used in the acquisition of the diagnostic measurement data. For example, the field probes of the field mapping device 30 can acquire $^{19}$Fluorine nuclei, and the acquired diagnostic measurement data can be with regard to protons in the examination subject. Therefore, the two measurements (data acquisition) running in parallel to not negatively affect one another.

When the measurement of the gradients occurs simultaneously with the acquisition of the measurement data, possible influences by the examination subject on the gradients are always currently detected as well. The calculated k-space trajectories and the image data sets reconstructed therefrom are therefore particularly reliably free of artifacts.

However, it is also possible to measure the measurement of the actual gradients present in the measurement volume in Step 201 separately from the acquisition of the measurement data. For example, at least the gradients to be switched for the acquisition of measurement data can be measured without the acquisition of measurement data in a separate measurement (for example a prescan) by the field mapping device 30, and can be stored in the gradient data set GDS. For this purpose, each gradient can be measured only once and can be retrieved from the gradient data set GDS for each of a number of later acquisitions of diagnostic measurement data. It can thus be sufficient to obtain a gradient data set GDS only once, for example in the course of the installation of the magnetic resonance system. In this case, the one-time use of a field mapping device is sufficient.

However, such a prescan can also be implemented for each acquisition of measurement data, so the measured gradients again precisely match the conditions prevailing in the measurement volume for the acquisition of the diagnostic measurement data. It is then not necessary to operate a field mapping device simultaneously for every acquisition of measurement data sets.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for generating an artifact-free magnetic resonance image data set comprising:
    acquiring magnetic resonance measurement data from an examination subject located in a measurement volume of a magnetic resonance data acquisition unit by operating the data acquisition unit according to a magnetic resonance data acquisition pulse sequence in which magnetic field gradients, which spatially encode said measurement data, are ramped continuously over time to a predetermined gradient strength for acquiring said measurement data, with no abrupt changes in said gradient strength;
    measuring actual magnetic field gradients that are present in said measurement volume of said data acquisition unit with a field mapping device located in said measurement volume;
    in a processor supplied with the measured actual magnetic field gradients, automatically calculating, based on the measured actual magnetic field gradients, trajectories along which said measurement data are entered into k-space during acquisition of said measurement data;
    in said processor, reconstructing an artifact-free magnetic resonance image data set from the acquired measurement data, dependent on the calculated trajectories; and
    making the artifact-free magnetic resonance image data set available at an output of said processor in electronic form as at least one data file.

2. A method as claimed in claim 1 comprising ramping said magnetic field gradients to said gradient strength after acquisition of said measurement data.

3. A method as claimed in claim 1 comprising activating said gradient magnetic fields non-constantly during an entirety of acquisition of said measurement data.

4. A method as claimed in claim 1 comprising activating said magnetic field gradients simultaneously with acquisition of said measurement data.

5. A method as claimed in claim 1 comprising measuring the actual magnetic field gradients that are present in said measurement volume in a measurement procedure that is separate from operating said data acquisition unit according to said pulse sequence.

6. A method as claimed in claim 1 comprising ramping said magnetic field gradients without abrupt changes in said gradient strength by making changes in said gradient strength over time are small enough to avoid mechanical oscillations in said data acquisition unit due to said changes in said gradient strength.

7. A magnetic resonance apparatus comprising:
    a magnetic resonance data acquisition unit comprising a measurement volume;
    a control unit configured to operate said data acquisition unit to acquire magnetic resonance measurement data from an examination subject located in the measurement volume of the magnetic resonance data acquisition unit, according to a magnetic resonance data acquisition pulse sequence in which magnetic field gradients, which spatially encode said measurement data, are ramped continuously over time to a predetermined gradient strength for acquiring said measurement data, with no abrupt changes in said gradient strength;
    a field mapping device located in said measurement volume that measures actual magnetic field gradients that are present in said measurement volume of said data acquisition unit;
    a processor supplied with the measured actual magnetic field gradients, configured to automatically calculate, based on the measured actual magnetic field gradients, trajectories along which said measurement data are entered into k-space during acquisition of said measurement data;
    said processor being configured to reconstruct an artifact-free magnetic resonance image data set from the acquired measurement data, dependent on the calculated trajectories; and
    said processor being configured to make the artifact-free magnetic resonance image data set available at an output of said processor in electronic form as at least one data file.

8. A non-transitory, computer-readable data storage medium encoded with programming instructions, said storage medium being loaded into a computerized control and evaluation system of a magnetic resonance apparatus that also comprises a magnetic resonance data acquisition unit that comprises a measurement volume, said programming instructions causing said control and evaluation system to:
    operate the data acquisition unit to acquire magnetic resonance measurement data from an examination subject located in the measurement volume of the magnetic resonance data acquisition unit, according to a magnetic resonance data acquisition pulse sequence in which magnetic field gradients, which spatially encode said measurement data, are ramped continuously over time to a predetermined gradient strength for acquiring said measurement data, with no abrupt changes in said gradient strength;
    operate a field mapping device located in said measurement volume to measure actual magnetic field gradients that are present in said measurement volume of said data acquisition unit;
    calculate, based on the measured actual magnetic field gradients, trajectories along which said measurement data are entered into k-space during acquisition of said measurement data;
    reconstruct an artifact-free magnetic resonance image data set from the acquired measurement data, dependent on the calculated trajectories; and
    make the artifact-free magnetic resonance image data set available at an output of said control and evaluation system in electronic form as at least one data file.

* * * * *